US006475818B1

(12) United States Patent
Kwon et al.

(10) Patent No.: US 6,475,818 B1
(45) Date of Patent: Nov. 5, 2002

(54) METHOD FOR FABRICATING MULTI-CHANNEL ARRAY OPTICAL DEVICE

(75) Inventors: O Kyun Kwon; Byueng Su Yoo; Jae Heon Shin; Jong Heob Baek, all of Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 09/498,507

(22) Filed: Feb. 4, 2000

(30) Foreign Application Priority Data

Dec. 20, 1999 (KR) .............................................. 99-59434

(51) Int. Cl.[7] .......................... G01R 31/26; H01L 21/00
(52) U.S. Cl. ............................ 438/22; 438/34; 438/35; 438/942
(58) Field of Search ............................. 438/22, 39, 38, 438/46, 29, 45, 47, 34, 942, 946, 947, 950, 35; 372/45, 46

(56) References Cited

U.S. PATENT DOCUMENTS

| 5,400,354 | A | * | 3/1995 | Ludowise et al. | 372/46 |
|---|---|---|---|---|---|
| 5,493,577 | A | * | 2/1996 | Choquette et al. | 372/46 |
| 5,739,945 | A | * | 4/1998 | Tayebati | 359/291 |
| 5,835,517 | A | | 11/1998 | Jayaraman et al. | 372/50 |
| 5,872,031 | A | * | 2/1999 | Mishra et al. | 438/216 |
| 5,886,370 | A | * | 3/1999 | Sun et al. | 257/94 |
| 5,897,329 | A | * | 4/1999 | Jewell | 438/38 |
| 5,915,165 | A | * | 6/1999 | Sun et al. | 438/47 |
| 5,917,847 | A | * | 6/1999 | Sun | 272/50 |
| 5,985,683 | A | * | 11/1999 | Jewell | 438/22 |
| 6,014,400 | A | * | 1/2000 | Kobayashi | 372/96 |
| 6,026,108 | A | * | 2/2000 | Lim et al. | 372/50 |
| 6,052,399 | A | * | 4/2000 | Sun | 372/50 |
| 6,238,944 | B1 | * | 5/2001 | Floyd | 438/45 |

OTHER PUBLICATIONS

MacDougal et al., "Wavelength Shift of Selectively Oxidized AlxOy–AlGaAs–GaAs Distributed Bragg Reflectors," *IEEE Photonics Technology Letters*, 9(7):884–886, Jul., 1997.

Shin et al., "Fabrication Method for Multiple Wavelength Vertical–Cavity Emitter Arrays by SiNx Layer Thickness Control," *IEEE Photonics Technology Letters*, 11(5):509–511, May, 1999.

\* cited by examiner

Primary Examiner—Trung Dang
Assistant Examiner—Brook Kebede
(74) Attorney, Agent, or Firm—Seed IP Law Group PLLC

(57) ABSTRACT

A method for fabricating a multi-channel array optical device having uniform spacing between different wavelengths and for having precise wavelengths by accomplishing wavelength adjustment and by the forming of mirror layers simultaneously through a multi-layer binary mask and a selective oxidization process. This method is especially useful for fabricating multi-channel array optical devices including multi-channel passive filters and multi-channel surface emitting laser arrays. The method includes forming a plurality of semiconductor mirror layers on a semiconductor substrate; forming an oxidization protective layer on the plurality of semiconductor mirror layers; selectively removing the oxidization protective layer by using a binary mask to expose the semiconductor mirror layer which will adjust a wavelength; oxidizing the exposed semiconductor mirror layer.

5 Claims, 4 Drawing Sheets

_US 6,475,818 B1_

METHOD FOR FABRICATING MULTI-CHANNEL ARRAY OPTICAL DEVICE

TECHNICAL FIELD

The present invention is related to methods for fabricating multi-channel array optical device to achieve a uniform interleaving between different wavelengths and having precise wavelengths by accomplishing wavelengths adjustment and the forming of mirror layers simultaneously through a multi-layer binary mask and a selective oxidization process. The present invention is especially useful for fabricating multi-channel array optical devices including multi-channel passive filters and multi-channel surface emitting laser arrays.

BACKGROUND OF THE INVENTION

Previous methods for obtaining uniformly interleaved wavelengths between different wavelengths and for having precise wavelengths employed controlling the thickness through the etching after inserting a phase tuning layer at resonant structure to obtain the desired channel wavelengths. Alternatively, a way of controlling the growing structure thickness was used to select resonant wavelengths by giving a growing temperature gradient with respect to patterns, which were previously patterned at the bottom of the substrate when the device structure is growing.

However, disadvantages of the mentioned previous techniques include complexity due to the processes of forming material layers to vary the wavelengths and, are also complicated demanding additional upper mirror layers, and material layers to adjust the wavelengths.

SUMMARY OF THE INVENTION

The disclosed embodiments of the invention provide fabrication methods for multi-channel array optical devices with a uniform wavelength spacing and a precise wavelength as well as simplified processes by accomplishing wavelengths adjustment and by forming mirror layers simultaneously through a multi-layer binary mask and a selective oxidization process.

A method for fabricating a multi-channel array optical device is provided. The method includes the following: Forming a plurality of semiconductor mirror layers on a semiconductor substrate; forming an oxidization protective layer on the plurality of semiconductor mirror layers; selectively removing the oxidization protective layer by using a binary mask to expose the semiconductor mirror layer, which will adjust a wavelength; and oxidizing the exposed semiconductor mirror layer.

Preferably, the semiconductor mirror layer is repetitively stacked in the order of a layer of stable to oxidization, a layer of adjustable oxidization speed, a layer of sensitive to oxidization, a layer of adjustable oxidization speed, and a layer of stable to oxidization.

Preferably, the layer of stable to oxidization, the layer of adjustable oxidization speed, and the layer of sensitive to oxidization are GaAs, AlGaAs and AlAs, respectively.

Preferably, the AlGaAs layer is adjusted an oxidization speed in accordance with an amount of Al.

Preferably, the oxidization protective layer is silicon nitride.

Preferably, the oxidization process is wet oxidization under the H$_2$O and N$_2$ ambient with the temperature of 400° C. and 450° C.

A method for fabricating a multi-channel array optical device is provided. The method includes: Forming a plurality of semiconductor mirror layers on a semiconductor substrate; forming an oxidization protective layer on the plurality of semiconductor mirror layers; selectively removing the oxidization protective layer by using a binary mask to expose the semiconductor mirror layer, which will adjust a wavelength; oxidizing the exposed semiconductor mirror layer; removing the remained oxidization protective layer; and repetitively performing the second step to the fifth steps to adjust the wavelength of the semiconductor mirror layers by using binary masks that have different light exposure widths.

BRIEF DESCRIPTION OF THE DRAWINGS

The disclosed embodiments of the present invention will be explained with reference to the accompanying drawings, in which.

DETAILED DESCRIPTION OF THE INVENTION

Figure 1A:
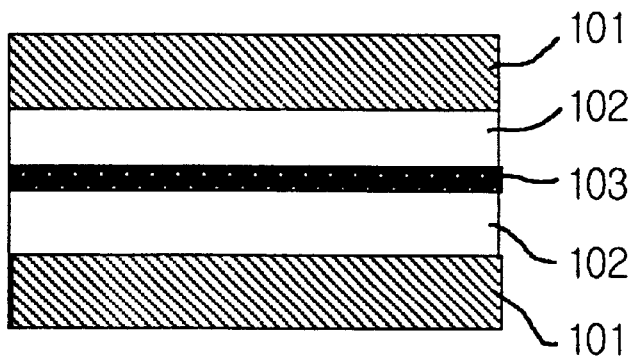
FIG. 1A to Figure 1C illustrate the principle of a semiconductor mirror layer forming structure.
Figure 1B:
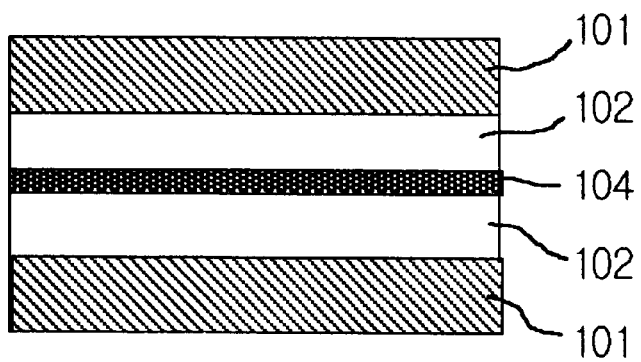
Figure 1C:
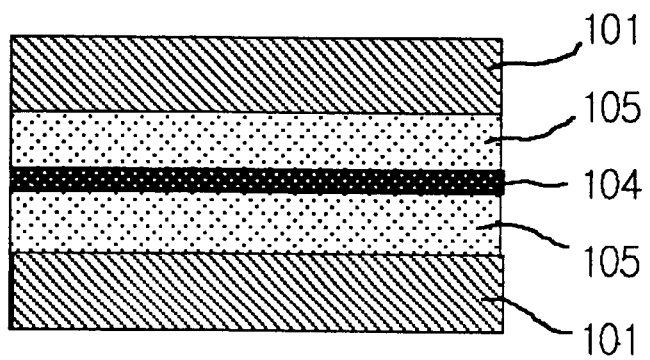

FIG. 1A to FIG. 1C illustrate the principle of forming the semiconductor mirror layer through wet oxidization in accordance with an embodiment of this invention.

Generally, for having a high reflective index (n) to the optical device's operating resonant wavelength of the semiconductor mirror layer, two different materials which have different reflective indexes are stacked with the thickness of $\lambda/4n$.

The present invention utilizes a Gallium Arsenade (GaAs) layer 101 as a high reflective index material, and an Aluminum Gallium Arsenade (AlGaAs) layer 102 and an Aluminum Arsenade (AlAs) layer 103 as a low reflective index material, for the mentioned different reflective index materials.

Additionally, in forming the mirror layer through the present invention's wet oxidization, the GaAs layer 101 works as a stable layer and the AlAs layer 103 works as a sensitive layer to the wet oxidization. And the AlGaAs layer 102 can control the oxidization speed in accordance with the amount of Aluminum (Al).

For more explanation in detail, semiconductor mirror layer of the presented invention is formed as a repetitive stacked way in the order of GaAs 101, AlGaAs 102, AlAs 103, AlGaAs 102 and GaAs 101, respectively, as illustrated in FIG. 1A. Then, wet oxidization is processed. Wet oxidization is processed under H$_2$O and N$_2$ with the temperature of 400° C.~450° C.

After the wet oxidization, the AlAs 103 layer is completely oxidized after passing some oxidization ($t_o$) time and is changed to Oxidized Aluminum (AlxOy) layer 104 as depicted in FIG. 1B. Processing additional oxidization (t>t$_o$) induces the formation of a partially oxidized AlGaAs layer 105 as illustrated in FIG. 1C.

At this time, the degree of oxidization depends on the gradient of the aluminum in accordance with the thickness of AlGaAs layer. In other words, due to the oxidization film increment, reflection index is changing and correspondingly, the center wavelength of the mirror layer is shifting.

The shift of the center wavelength can be expressed mathematically as Equation 1.

$$\Delta\lambda = 2\Delta t_{ox}\left(n_{ox} - \frac{n_{semi}}{r}\right) \quad \text{[Equation 1]}$$

where, $t_{ox}$, $n_{ox}$, $n_{semi}$ and r represent thickness change of the oxidization film, refractive index of oxidization film, reflective index of the semiconductor layer and, the ratio of the oxidization film's thickness with respect to the consumed semiconductor layer, respectively. If the reflective indexes of the AlGaAs layer and oxidization film are 3.2 and 1.55 respectively, and r is 0.88, then $\Delta\lambda$ becomes $-4.01\Delta t_{ox}$, which shifts to the short wavelength in accordance with oxidization.

Hence, for the optical device having the resonant structure, if this oxidized semiconductor film is applied, the Fabry-Perot resonant wavelength, $\lambda_{re}$, is obtained as Equation 2.

$$\lambda_{re} = \frac{2\pi n L}{2m\pi - \Phi_t - \Phi_b} \quad \text{[Equation 2]}$$

where, L, n, m, $\Phi_t$ and $\Phi_b$ represent the length of the resonance cavity, reflective index of the resonance cavity, constant, the phase change of upper mirror layer, and the phase change of lower mirror layer, respectively. In other words, the oxidization degree directly affects resonant wavelength shift and enables adjustment of the wavelength.

FIG. 2A to FIG. 2D illustrate the example of the mirror layer fabrication process using the binary mask as depicted in FIG. 1.

Figure 2A:
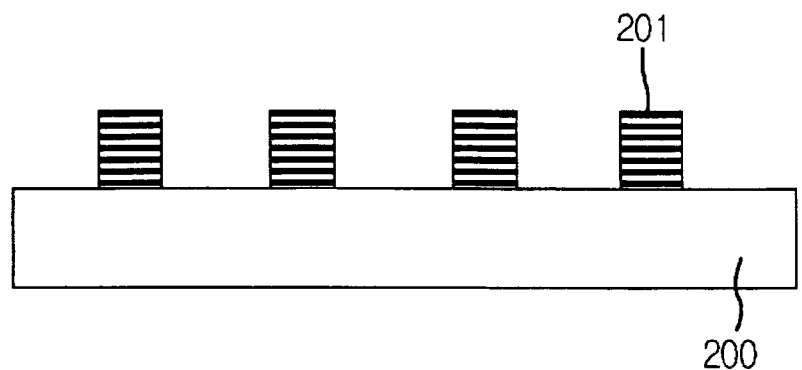
FIG. 2A to FIG. 2D illustrate the example of the mirror layer fabrication process by the using binary mask as depicted in FIG. 1.

As illustrated in FIG. 2A, after repetitively stacking material layers in the order of the GaAs layer, AlGaAs layer, AlAs layer, AlGsAs layer and GaAs layer on the semiconductor layer, perform the patterning to form the numerous semiconductor mirror layers 201.

Figure 2B:
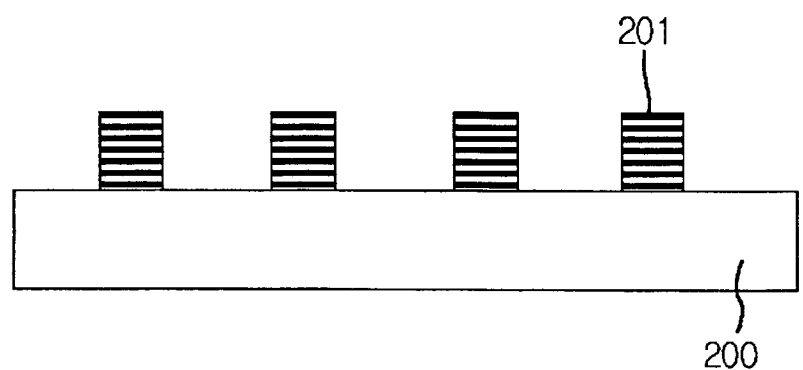

After the above procedure, as illustrated in FIG. 2B, deposit the Silicon Nitride (SiNx) film 202, which acts as the oxidization protective film, in front of the numerous semiconductor mirror layer with a thickness of 200 nm by PECVD (Plasma Enhanced Chemical Vapor Deposition) method.

Figure 2C:
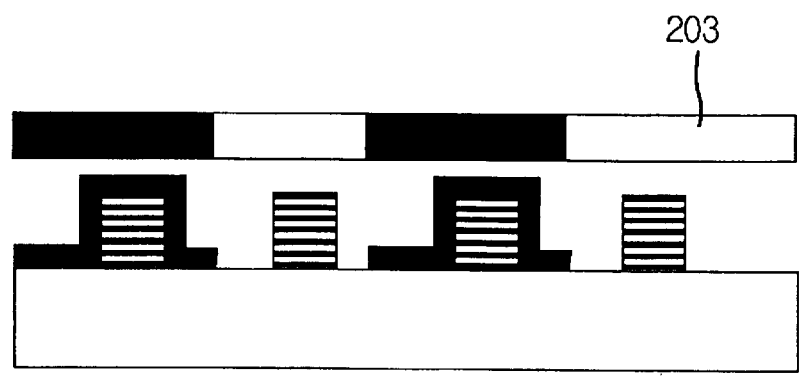
Figure 2D:
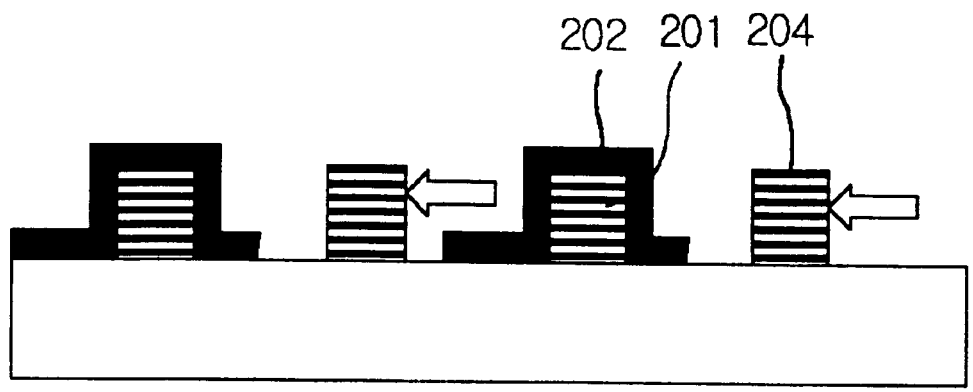

Then, perform a selective etching of the SiNx film by RIE (Reactive Ion Etching) method using the binary mask 203 as illustrated in FIG. 2C. Through the selective etching, the semiconductor mirror layer and some area of semiconductor substrate, which are to adjust the wavelength, are disclosed.

After the above procedure, a wet oxidization is performed. The wet oxidization process is progressed in a vapor (H$_2$O+N$_2$) with the temperature of 400° C.~450° C., and the disclosed mirror layer becomes oxidized mirror layer 204, and the mirror layer 201 protected by the SiNx film is not oxidized.

Then, after the selective oxidization process is done, remove the remaining SiNx film and proceed the post processes. Namely, the disclosed mirror layer induces a change in the wavelength, and the SiNx film protected mirror layer does not change the wavelength. In this way, by using the binary mask in multiple layers and repeating the mentioned processes, it is possible to have different wavelength mirror layers.

Figure 3:
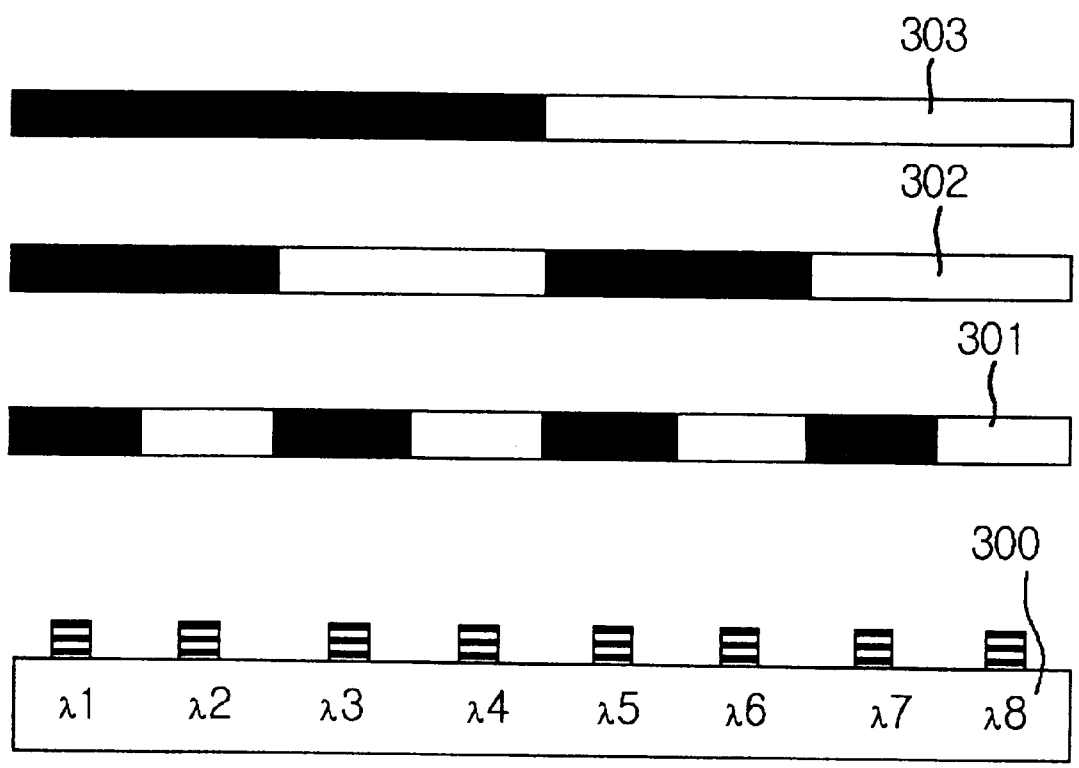
FIG. 3 illustrates the example of an 8-channel array device fabrication process using the multi-channel binary mask in forming the semiconductor mirror layer following the principle depicted in FIG. 1.

FIG. 3 illustrates an example of an 8-channel array device fabrication process using the multi-channel binary mask in forming the semiconductor mirror layer in accordance with the present invention.

Three binary masks are required in total for fabricating eight (8) channels and processing proceeds in the order of each of the mask steps 301, 302 and 303, respectively. As a mask material of each mask step, SiNx is used, as an example, and each mask's light exposure width is different.

If wet oxidization is processed by using the first mask 301, in the same manner as explained in reference to FIG. 2, the oxidization occurs at the mirror layers of λ2, λ4, λ6 and λ8. And then, if the wet oxidization is processed using the second mask 302, the oxidization occurs at the mirror layers of λ3, λ4, λ7 and λ8.

Here, the mirror layers of λ4 and λ8 experience two (2) times the oxidization process. Lastly, if the wet oxidization is processed using the third mask 303, the oxidization occurs at the mirror layers of λ5, λ6, λ7 and λ8. At this time, mirror layers of λ5, λ6, λ7 and λ8 experience the oxidization one (1), two (2), two (2) and three (3) times, respectively. And during the three steps, if the oxidization processing time is adjusted, each of the eight (8) mirror layers can have different wavelengths each other.

Table 1 presents oxidation time after applying the binary mask and the total oxidization time of each channel after the final process for forming the eight channels.

And the unit of the each time represents the additional unit time (T) after the complete oxidization time (t$_o$) of AlAs layer.

TABLE 1

| Channel | First mask (301) | Second mask (302) | Third mask (303) | Total oxidation time |
|---------|------------------|-------------------|------------------|---------------------|
| λ1 | 0 | 0 | 0 | 0 |
| λ2 | T | 0 | 0 | 1T |
| λ3 | 0 | 2T | 0 | 2T |
| λ4 | T | 2T | 0 | 3T |
| λ5 | 0 | 0 | 4T | 4T |
| λ6 | T | 0 | 4T | 5T |
| λ7 | 0 | 2T | 4T | 6T |
| λ8 | T | 2T | 4T | 7T |

As shown in Table 1, if the oxidization time is differentiated as 2 T at the second mask step and 4 T at the third mask step, channels are formed with a different oxidation time. If applied to the 16 channels' case, a 4 step binary mask can be used with the same method as above.

And, for a desirable process, it is very beneficial to have a linear wavelength shift, which occurs in accordance with oxidization time during the additional time applied after the t$_o$.

Figure 4:
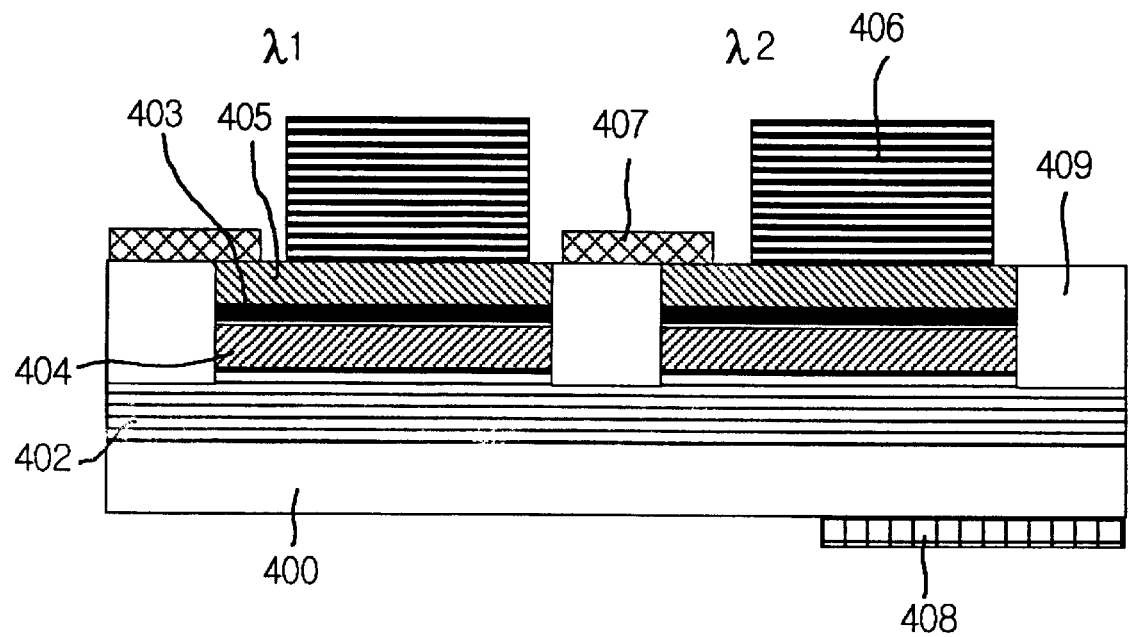
FIG. 4 illustrates the multi-channel surface emitting laser array as an example of a realized device in accordance with the present invention.

FIG. 4 illustrates a multi-channel surface emitting laser array as an example of a realized device using the present fabrication method. The multi-channel surface emitting laser array is formed with cladding layers 404, 405 including lower semiconductor mirror layer 402 and active layer 403 on the conductive substrate. And upper semiconductor mirror layer 406 is formed on those cladding layers. The cladding layers are divided into lower cladding layer 404 and upper cladding layer 405 with respect to the active layer.

And for a current injection, ohmic metal layer 407, 408 is formed at the upper cladding layer and the bottom of the substrate and, a hydrogen implanted insulation layer 409 is also formed for the insulation between the elements.

Here, the upper semiconductor mirror layer is fabricated with the present invention, which is characterized by having different wavelengths due to the different oxidization time. Namely, while previous techniques required additional materials to change wavelengths and then adjust the wavelength by controlling the thickness through the etching and, also required the additional upper mirror layer, but the present invention forms the upper mirror layer, which enables adjustment of the wavelength through the oxidization process. And correspondingly, it has the merits of fabricating thinner thickness with a simplified process.

Figure 5:
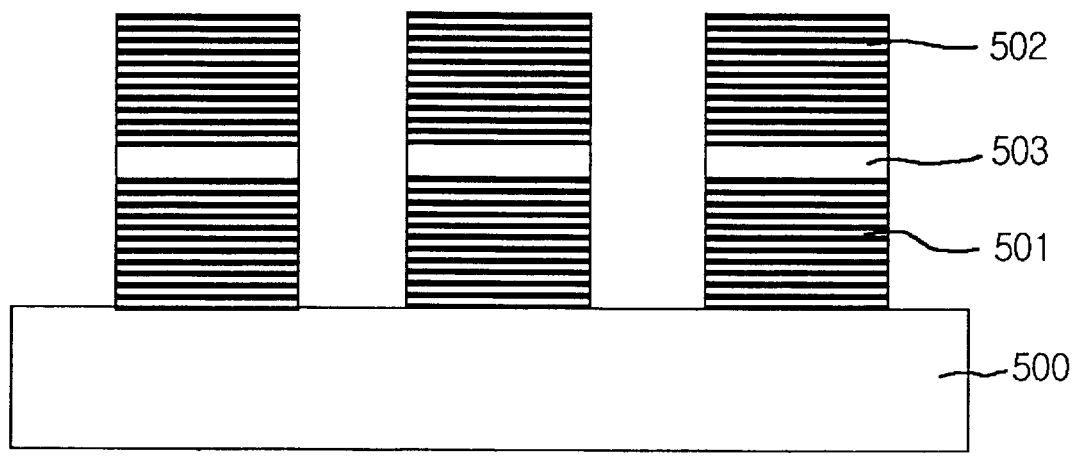
FIG. 5 illustrates the multi-channel passive filter array as the other example of a realized device in accordance with the present invention.

FIG. 5 illustrates the multi-channel passive filter array as an example of realized device using the present invention On the substrate 500, semiconductor mirror layers, consisting of upper mirror layer 501 and lower mirror layer 502, are formed. And between the each mirror layers, a resonant structure 503 filled with passive medium is formed.

In this case, all the upper and lower mirror layers are formed by the fabrication method through the present invention. From this way, it is possible to utilize a wider wavelength range by having two times a wider wavelength shift by using all the upper and lower layers than that of using only the upper mirror layer as illustrated in FIG. 4. Moreover, it can perform selecting a specific wavelength among the multi-channel wavelength signals or, perform wavelength routing functions effectively.

Although representative embodiments of the present invention have been disclosed for illustrative purposes, those who are skilled in the art will appreciate that various modifications, additions and substitutions are possible without departing from the scope and spirit of the present invention as defined in the accompanying claims and the equivalents thereof.

What we claim:

1. A method for fabricating a multi-channel array optical device, comprising the steps of:

a first step for forming a plurality of semiconductor mirror layers on a semiconductor substrate;

a second step for forming an oxidization protective layer on the plurality of semiconductor mirror layers;

a third step for selectively removing the oxidization protective layer by using a binary mask to expose the semiconductor mirror layers, a wave length of which will be adjusted;

a fourth step for oxidizing the exposed semiconductor mirror layers; and a fifth step for removing the oxidization protective layer remaining on the unexposed semiconductor mirror layers; and wherein after completing the fifth step, the subprocess from the second step to the fifth step is repeated at least one time and the binary mask being used in each subprocess has a light exposure width different from those of the binary masks used in previous repetitions of the subprocess defined by the second step through the fifth step.

2. The method of claim 1, wherein the semiconductor mirror layer is repetitively stacked in the order of a layer of stable to oxidization, a layer of adjustable oxidization speed a layer of sensitive to oxidization, a layer of adjustable oxidization speed, and a layer of stable to oxidization.

3. The method of claim 2, wherein the layer of stable to oxidization, the layer of adjustable oxidization speed, and the layer of sensitive to oxidization are GaAs, AlGaAs and AlAs, respectively.

4. The method of claim 3, wherein the AlGaAs layer is adjusted for an oxidization speed in accordance with an amount of Al.

5. The method of claim 1, wherein the oxidization protective layer is silicon nitride.

* * * * *